(12) United States Patent
De Jong

(10) Patent No.: US 8,436,324 B2
(45) Date of Patent: May 7, 2013

(54) PREPARATION UNIT FOR LITHOGRAPHY MACHINE

(75) Inventor: Hendrik Jan De Jong, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 233 days.

(21) Appl. No.: 12/709,640

(22) Filed: Feb. 22, 2010

(65) Prior Publication Data

US 2010/0238421 A1    Sep. 23, 2010

Related U.S. Application Data

(60) Provisional application No. 61/306,521, filed on Feb. 21, 2010, provisional application No. 61/154,411, filed on Feb. 22, 2009, provisional application No. 61/154,415, filed on Feb. 22, 2009.

(30) Foreign Application Priority Data

Apr. 3, 2009   (GB) .................................. 0905789.4

(51) Int. Cl.
    *G21G 5/00*      (2006.01)
    *B25B 11/00*     (2006.01)
(52) U.S. Cl.
    USPC .................. 250/492.1; 250/492.2; 269/20

(58) Field of Classification Search ............... 250/492.1, 250/492.2, 492.3; 269/20
    See application file for complete search history.

(56) References Cited

U.S. PATENT DOCUMENTS

| | | | |
|---|---|---|---|
| 4,951,601 A | 8/1990 | Maydan et al. | |
| 5,536,128 A | 7/1996 | Shimoyashiro | |
| 2004/0247417 A1 | 12/2004 | Fujimura et al. | |
| 2005/0259236 A1 | 11/2005 | Straaijer | |
| 2007/0114440 A1* | 5/2007 | Yang | 250/440.11 |
| 2008/0286491 A1 | 11/2008 | Takahashi et al. | |

FOREIGN PATENT DOCUMENTS

| | | |
|---|---|---|
| EP | 1109203 A2 | 6/2001 |
| WO | 0223597 A2 | 3/2002 |
| WO | 2004021411 A2 | 3/2004 |
| WO | 2009011574 A1 | 1/2009 |

* cited by examiner

*Primary Examiner* — Jack Berman
*Assistant Examiner* — Hanway Chang
(74) *Attorney, Agent, or Firm* — Hoyng Monegier LLP; David P. Owen; Coraline J. Haitjema

(57) ABSTRACT

A charged particle lithography system comprising a preparation unit. The preparation unit comprises a housing having a first load port for loading and/or unloading a substrate into or out of the housing, a substrate transfer unit for locating the substrate onto a substrate support structure within the housing, and a second load port for loading and/or unloading the substrate support structure supporting the substrate.

23 Claims, 10 Drawing Sheets

FIG. 6A    FIG. 6B

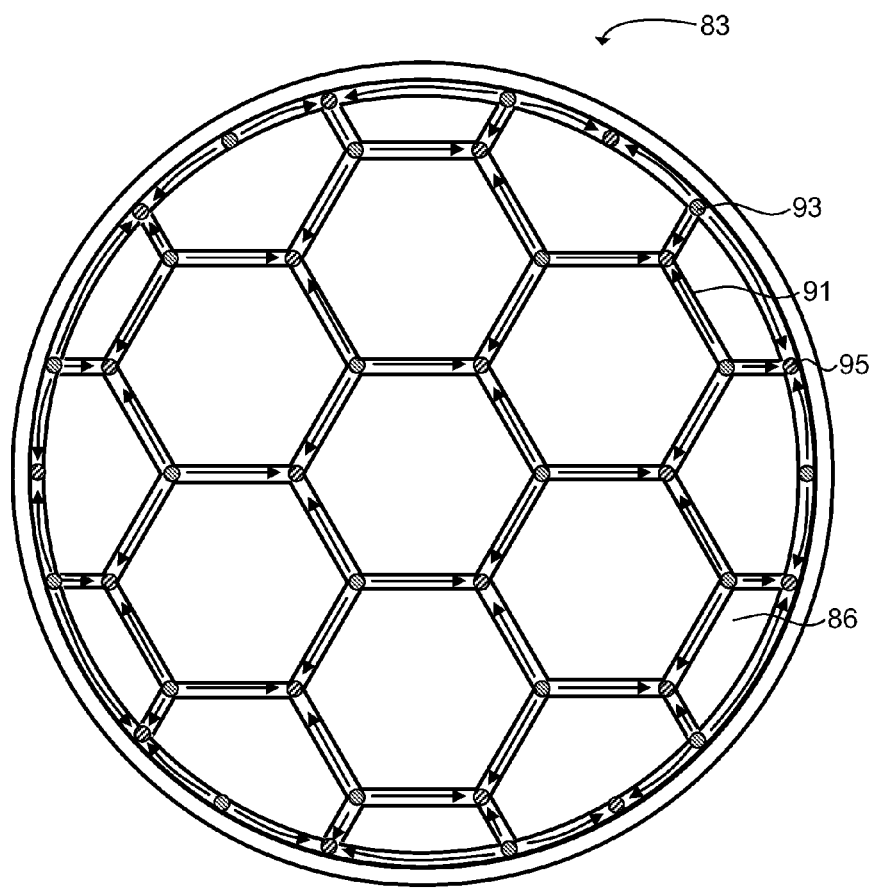
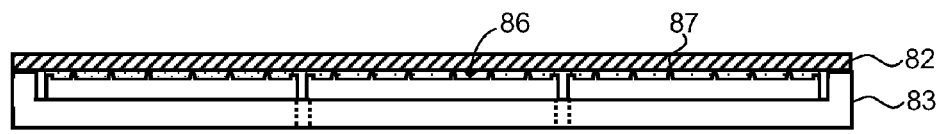
FIG. 8A
FIG. 8B

PREPARATION UNIT FOR LITHOGRAPHY MACHINE

CROSS REFERENCE TO RELATED APPLICATIONS

This application claims priority to U.S. provisional application No. 61/154,411 filed on Feb. 22, 2009, U.S. provisional application No. 61/154,415 filed on Feb. 22, 2009, U.S. provisional application No. 61/306,521 filed on Feb. 21, 2010, and British application no. GB 0905789.4 filed on Apr. 3, 2009. All these applications are hereby incorporated by reference in their entirety.

BACKGROUND OF THE INVENTION

1. Field of the Invention

The present invention generally relates to a preparation unit for a lithography machine, and more particularly to a unit and method for preparing a substrate for processing in a lithography system.

2. Description of the Related Art

Lithography and inspection systems typically require the object being processed, usually referred to as a substrate or wafer, to be prepared prior to the lithography or inspection process to improve the accuracy of the process. An example of such preparation is the clamping of a substrate onto a rigid support surface to enable high precision patterning of the substrate. The lithography or inspection process is typically performed in a vacuum environment, and the process typically imparts energy to the substrate which results in heating of the substrate. Efficient automation of the preparation process is desired to ensure high throughput of the lithography or inspection system while dealing with these issues.

BRIEF SUMMARY OF THE INVENTION

It is an object of the invention to provide a preparation unit for preparing a substrate for processing in a lithography or inspection machine. In one aspect the invention comprises a charged particle lithography system comprising a preparation unit. The preparation unit comprises a housing having a first load port for loading and/or unloading a substrate into or out of the housing, a substrate transfer unit for locating the substrate onto a substrate support structure within the housing, and a second load port for loading and/or unloading the substrate support structure supporting the substrate. The system may also include a lithography apparatus for performing a lithographic process on the substrate in a substrate processing compartment, the preparation unit further comprising an energy discharge system for removing energy accumulated in the substrate support structure as a result of the lithographic process, after removal of the substrate support structure from the substrate processing compartment. The preparation unit may be provided with connections for discharge and supply of an energy transport medium for the energy discharge system, and the energy transport medium may comprise a fluid. The energy discharge system may comprise an electrically driven thermoelectric cooling element, and the cooling element may include conduits for a cooling fluid, the conduits being at least partly outside the housing. The preparation unit may be adapted for exposure of the substrate support structure to the energy transport medium. The energy transport medium may be a fluid, preferably water.

The system may also be adapted for recycling one or more substrate support structures between the preparation unit and a lithographic apparatus. The preparation unit may include a last-in last-out buffer system within the unit for containing a plurality of substrate support structures, and the housing may provide a controlled pressure environment.

The preparation unit may be further configured to clamp the substrate on a surface of the substrate support structure by means of a capillary liquid layer. An energy transport medium may be used as described above, and may comprise a liquid and be used at least partly for a capillary liquid layer for clamping the substrate on a surface of the substrate support structure, and the energy transport medium may be provided for the capillary liquid layer in excess of the amount of liquid required for clamping the substrate. The preparation unit may further comprise a liquid dispenser for dispensing liquid on a surface of the substrate support structure to form the capillary liquid layer.

The pressure within the housing may be lowered to a pressure substantially equal to the vapor pressure of the liquid in the capillary layer. The substrate transfer unit may comprise support pins for lowering the substrate onto the substrate support structure. The preparation unit may further comprises one or more gas connectors connectable to the substrate support structure for providing gas to and/or removing gas from the surface of the substrate support structure, and the gas may comprise nitrogen. The preparation unit may also comprise one or more liquid connectors connectable to the substrate support structure for providing liquid to and/or removing liquid from the surface of the substrate support structure.

The substrate support structure is freely movable, without wires, tubes of other connections connected to it which may impede its movement.

The preparation unit may include a liquid dispenser for dispensing liquid on a surface of a substrate support structure, one or more gas connectors for providing gas to and/or removing gas from the surface of the substrate support structure, and one or more liquid connectors for providing liquid to and/or removing liquid from the surface of the substrate support structure, wherein the substrate support structure is connectable and disconnectable from the one or more gas connectors, and the one or more liquid connectors.

The system may also comprise a plurality of lithographic apparatus, each lithographic apparatus comprising a radiation system to provide a patterned beam of radiation, a substrate support structure to support a substrate, and an optical system to project the patterned beam of radiation onto a target portion of the substrate, and wherein the preparation unit is configured to provide a substrate clamped to a substrate support structure for each of the plurality of lithographic apparatus.

According to another aspect of the invention, a method is provided for preparing a substrate for lithographic processing. The method comprises providing a controlled pressure environment in a housing, loading the substrate into the housing, providing the substrate support structure in the housing, and clamping the substrate on a surface of the substrate support structure by means of a capillary layer. The method may further comprise dispensing a liquid on a surface of a substrate support structure to form the capillary layer, and may comprise lowering the substrate onto the dispensed liquid.

The method may further comprise connecting one or more gas connectors to the substrate support structure and providing gas to and/or removing gas from the surface of the substrate support structure, and may also comprise connecting one or more liquid connectors to the substrate support structure and providing liquid to and/or removing liquid from the surface of the substrate support structure. The method may also include lowering the pressure within the housing to a pressure substantially equal to the vapor pressure of the liquid in the capillary layer.

The method may include dispensing a liquid on a surface of a substrate support structure, connecting one or more gas connectors to the substrate support structure and providing gas to and/or removing gas from the surface of the substrate support structure, connecting one or more liquid connectors to the substrate support structure and providing liquid to and/or removing liquid from the surface of the substrate support structure, and disconnecting the one or more gas connectors and the one or more liquid connectors from the substrate support structure. The method may further comprise loading an unclamped substrate into the housing via a first port and unloading the substrate clamped to the substrate support structure out of the housing via a second port.

The method may also include conditioning the substrate support structure before clamping the substrate on a surface of the substrate support structure. Conditioning the substrate support structure may comprise actively removing energy accumulated in the substrate support structure as a result of a previous lithographic process. The conditioning may comprise exposing the substrate support structure to an energy transport medium for removing the stored energy, and the energy transport medium may comprise a fluid. The conditioning may comprise placing the substrate support structure in thermal contact with an electrically driven thermoelectric cooling element.

It will be evident that the presently invented principle may be put into practice in various ways.

BRIEF DESCRIPTION OF THE DRAWINGS

Various aspects of the invention will be further explained with reference to embodiments shown in the drawings wherein:

FIGS. 6A-6C are top views of the substrate support structure of FIG. 5 further schematically illustrating the concept of reclamping;

FIG. 8A schematically shows a top view of a substrate support structure according to a third embodiment of the invention;

FIG. 8B schematically shows a sectional view of a clamp formed by a combination of the substrate support structure of FIG. 8A and a substrate;

In the figures, corresponding structural features, i.e. at least functionally, are referred to by identical reference numbers.

DESCRIPTION OF ILLUSTRATIVE EMBODIMENTS

The following is a description of various embodiments of the invention, given by way of example only and with reference to the drawings.

Figure 1:
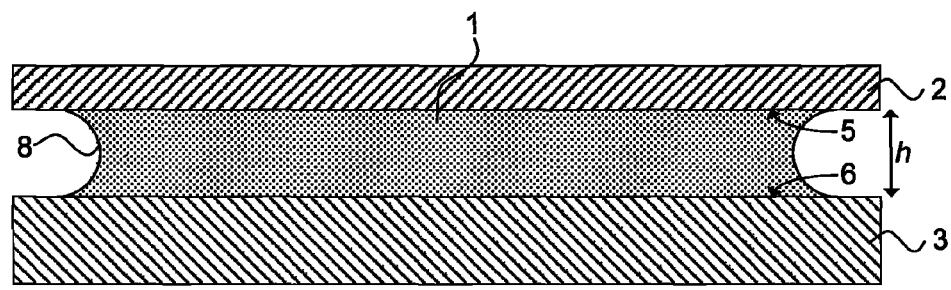
FIG. 1 is a sectional view schematically illustrating a capillary layer between two structures.

FIG. 1 is a sectional view schematically illustrating a capillary liquid layer 1 of a capillary liquid, e.g. water, between a first substrate 2, e.g. a wafer, and a second substrate 3, e.g. a substrate support structure like a wafer table. The first and second substrates 2, 3 have a substantially flat surface 5, 6 respectively. The nominal distance between the opposing surfaces 5, 6 of the first and second substrates 2, 3 is given by height h. The capillary liquid layer 1 has an outer liquid surface 8, which is generally concavely shaped due to adhesive connection of the liquid to the first substrate 2 and the second substrate 3.

The concave liquid surface 8 tends to maintain its shape if the first substrate 2 and the second substrate 3 are subject to forces in a direction substantially perpendicular to the opposing surfaces 5, 6. The concaveness of the outer liquid surface 8 depends on the contact angle between the capillary layer 1 and the surface 5 of the first substrate 2, and on the contact angle between the capillary layer 1 and the surface 6 of the second substrate 3. The respective contact angles depend on the liquid used in the capillary layer 1 as well as on the material properties of the two substrates 2, 3. More details with respect to a capillary layer holding together two structures with substantially flat opposing surface is provided in international patent application WO2009/011574, which is incorporated herein by reference in its entirety.

Figure 2:
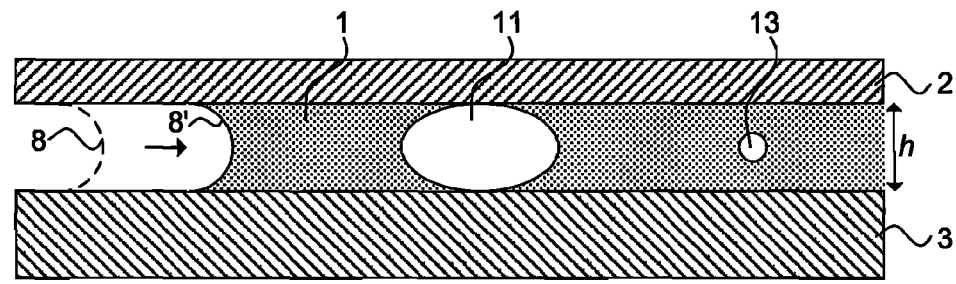
FIG. 2 is a sectional view schematically illustrating processes with a negative impact on the clamp stability of the capillary layer of FIG. 1.

FIG. 2 is a sectional view schematically illustrating processes with a negative impact on the stability of the clamping action performed by means of the capillary liquid layer 1 of FIG. 1. Hereafter, the expression "clamp" will be used for the arrangement where the substrate 2 is clamped to the substrate support structure 3 by means of the capillary layer 1.

If pre-existing bubbles are present in the liquid, introduction of the clamp (i.e. the substrate clamped to the substrate support unit) into a vacuum environment will lead to expansion of such bubbles within the capillary layer. The size of initially small bubbles can grow by several orders of magnitude if ambient pressure decreases, e.g. from 1 bar to $10^{-6}$ mbar. As can be readily seen in FIG. 2, a bubble of the size of bubble 11 may seriously influence the clamping strength, at least locally, and may have a negative influence on the stability of the clamp.

Another mechanism that may lead to clamp instability is spontaneous void formation, for example caused by cavitation of or dissolved gas precipitation in the capillary liquid layer. An example of such a void has been denoted by reference numeral 13 in FIG. 2. Voids formed by cavitation may grow in a similar way as discussed before with respect to pre-existing bubbles if the clamp is brought into a vacuum environment. The resulting voids may have a negative influence on the clamp stability.

Besides decrease of the clamp stability due to the presence of bubbles and/or voids, the clamp stability will also be negatively affected by evaporation of liquid at the capillary layer interface, i.e. evaporation at the concave liquid surface. FIG. 2 schematically shows the effect of such evaporation. Due to evaporation, the position of the outer liquid surface 8 has shifted towards a new position to form outer liquid surface 8'. As a result of that shift, the surface area covered by the capillary layer, and thus the stability of the clamp, has decreased.

Figure 3A:
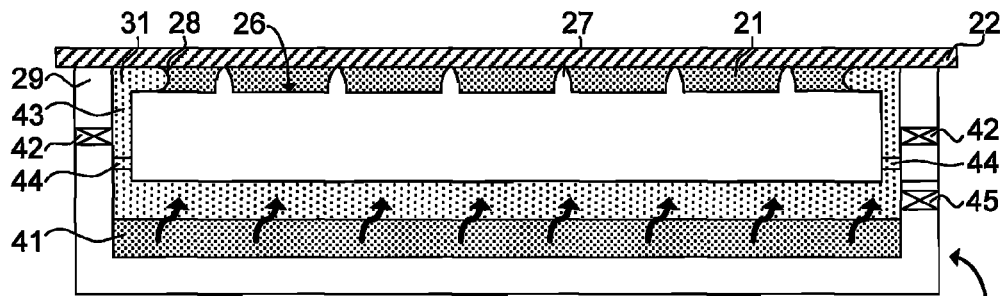
FIG. 3A is a sectional view of a substrate support structure according to a first embodiment of the invention.
Figure 3B:
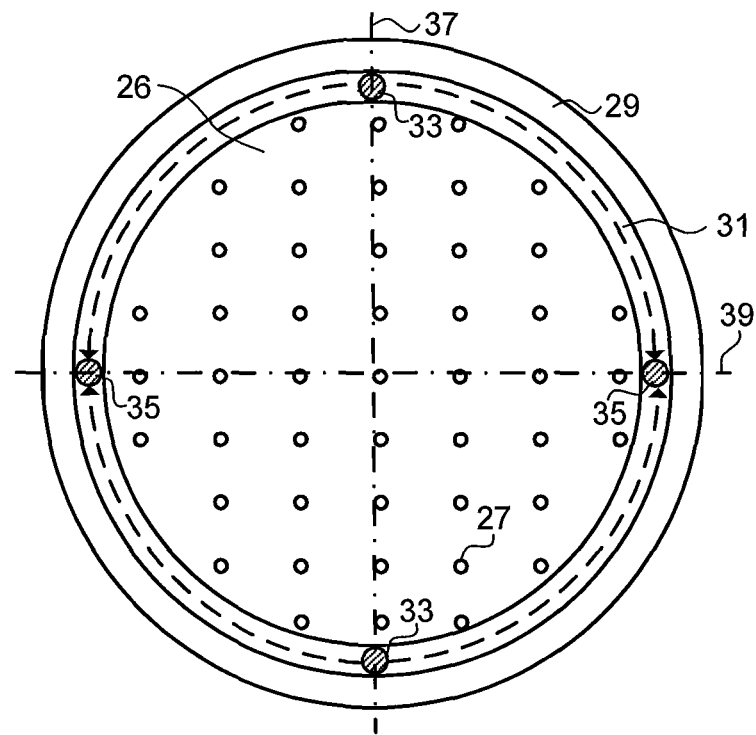
FIG. 3B is a top view of the substrate support structure of FIG. 3A.

FIGS. 3A and 3B are a sectional view and a top view of a substrate support structure 23 supporting a substrate according to a first embodiment of the invention respectively. The support structure is equipped to clamp a substrate 22 by means of a capillary layer 21. The surface 26 of the substrate support structure 23 is provided with a plurality of contact elements 27 in the form of burls. The substrate support structure 23 further comprises a sealing structure 29 and a liquid removal system.

In addition to or instead of using burls as contact elements 27, a plurality of spacers, e.g. glass grains, $SiO_2$ grains or the like may be dispersed uniformly over the surface 26 of the substrate support structure 23. The presence of contact elements like burls may reduce the influence of contamination by particles on the backside of the substrate 22. Furthermore, the contact elements serve the purpose of keeping the substrate 22 substantially flat by withstanding the clamping force of the capillary layer to prevent the occurrence of substrate bow.

The maximum pitch of contact elements 27 is determined by the requirements set for the maximum deflection of the substrate between adjacent contact elements caused by the clamping force of the capillary layer. The contact surface per contact element is such that it is sufficient to withstand deformation and/or destruction under the applied clamping pressure. Preferably, edges of a contact element are rounded to reduce the possibility of particle contamination, e.g. during cleaning operations. A typical value for the diameter of a burl 27 with a circular contact area would be in the range of 10-500 microns. A typical value for the pitch of a plurality of burls 27 would be in the range of 1-5 mm.

The nominal height of the contact elements determines the distance between the substrate 22 and the surface 26 of the substrate support structure 23, and thus the clamping pressure. Other parameters that may be varied to obtain a desired clamping pressure include material properties of the substrate 22, material properties of the surface 26 of the substrate support structure 23, surface area of the surface 26, contact element shape, contact element pitch, and the type of liquid used to form a capillary layer 21.

The sealing structure 29 circumscribes the surface 26 of the substrate support structure 23 facing the substrate 22 to be clamped. The sealing structure 29 may limit leakage of liquid evaporating from the capillary layer 21, when present. Preferably, the top side of the sealing structure 29 has a level corresponding in height with the nominal height of the plurality of burls 27. Such an arrangement increases the efficiency of vapor leakage prevention, which is in particular an issue in a vacuum environment.

The sealing structure 29 may comprise one or more elastically deformable elements like O-rings, e.g. made of viton or rubber. Such O-rings may be inserted in a part of the substrate support structure 23 with reduced height such that the top side of the O-ring is set to the level mentioned above.

The O-ring may be provided with an incision at a radial side, e.g. the radial side facing the center of the substrate support structure 23, such that the O-ring can be compressed between substrate support structure 23 and substrate 22 without undue force requirement, but sufficient to prevent leakage of vapor.

Alternatively, as in FIG. 3A, the sealing structure 29 may comprise a vapor limiting ring, supported by an outer rim of the substrate support structure 23. The vapor limiting ring closes off the circumferential opening facing the capillary liquid surface, only leaving a very small vertical distance between the ring and the substrate 22 supported by the plurality of burls 27 on the surface 26 of the substrate support structure 23.

The liquid removal system is configured to remove liquid underneath the substrate to enable formation of a capillary layer 21. Further details regarding the formation of a capillary layer 21 by using a liquid removal system will be discussed with reference to FIG. 7.

The liquid removal system is configured to remove excess water from the surface 26 of the substrate support structure 23. In FIG. 3A, the liquid removal system comprises a gas distribution system, an embodiment of which is partly shown in FIG. 3B. The gas distribution system may comprise a moat 31 in circumference of the surface 26, one or more gas inlets 33 for allowing gas into the moat 31 and one or more gas outlets 35 for removing gas from the moat 31 respectively. If a sealing structure 29 is present, a gas flow may be established between the surface 26 provided with a liquid layer and the sealing structure 29, thus forming a channel flow as shown in FIG. 3B by the dashed arrows.

The one or more gas inlets 33 and the one or more gas outlets 35 may be provided along the moat 31 in a symmetrical fashion. In the embodiment of FIG. 3B, there are two gas inlets 33 and two gas outlets 35. The gas inlets 33 and gas outlets 35 are positioned in such a way that a first virtual line 37 formed by connecting the two gas inlets 33, and a second virtual line 39 formed by connecting the two gas outlets 35 are substantially perpendicular with respect to each other.

The substrate support structure 23 shown in FIG. 3A further comprises a liquid reservoir 41. The liquid reservoir 41 is configured to accommodate a certain volume of liquid, for example water, and further to store vapor of that liquid. Furthermore, the liquid reservoir is arranged to provide vapor to the capillary layer 21 when present, for example via one or more channels 43. The reservoir may be referred to as liquid reservoir 41. Preferably, the liquid in the liquid reservoir 41, reservoir liquid, is the same as the liquid within the capillary layer 21, i.e. capillary liquid. A suitable liquid for both reservoir liquid and capillary liquid would be water.

The presence of a liquid reservoir provides a way to further decrease evaporation of liquid from the capillary layer 21 when present. The free surface area of the liquid in the reservoir is preferably larger than the free surface area of the concave outer surface 28 of the capillary layer 21. The larger free surface area of the liquid stored in the reservoir ensures that a sufficient amount of vapor is available to moisturize the environment of surface 28, resulting in less vaporization within the capillary layer 21.

The vapor may be transported from the liquid reservoir 41 towards the outer liquid surface 28 of the capillary layer 21 by means of the one or more gas inlets 33 and/or the one or more gas outlets 35. In such a case, the gas for use in the gas distribution system may be provided to the substrate support structure via a valve 45 that is also used to provide liquid to the liquid reservoir 41.

Alternatively, gas may be provided via one or more separate gas connection units. If such gas connection units are configured to provide the gas flow via the one or more channels 43 used to provide vapor to the capillary layer, the one or more channels 43 may be provided with a flow control unit 44. Such a flow control unit 44 is configured to separate gas flow via the gas connection unit from vapor originating from the reservoir 41.

In yet another alternative embodiment, the gas distribution system is entirely separate from the one or more elements to provide the vapor from the vapor reservoir 41 to the clamp.

As mentioned earlier with reference to FIG. 2, the layer of capillary liquid evaporates in a vacuum environment. Experiments have shown that the remaining volume of the capillary liquid layer tends to accumulate at one side of the clamp. Due to this asymmetric distribution of the capillary layer, one side of the substrate "peels off" the table. Hereafter, the effect will be referred to as substrate peeling.

Figure 4:
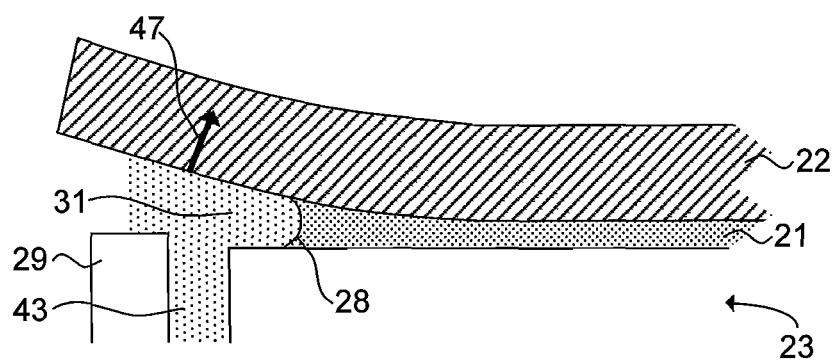
FIG. 4 schematically illustrates the concept of substrate peeling.

FIG. 4 schematically illustrates the concept of substrate peeling. Without wishing to be bound by theory, it is believed that due to unavoidable random instabilities the edge of the substrate 22 starts to lift away from the substrate support structure 23 at a location where the substrate 22 happens to be less strongly clamped. The movement of lifting is schematically represented in FIG. 4 by the arrow 47. Due to the peeling, vapor may more easily leak away from the capillary layer 21. Additionally, the outer liquid surface 28 of the capillary layer 21 increases, which leads to an increase in evaporation rate. Furthermore, the local peeling causes the capillary layer 21 to shift away from the area in which the peeling occurs. This leads to further unclamping. Thus, local peeling may limit the lifetime of the clamp significantly.

Figure 5:
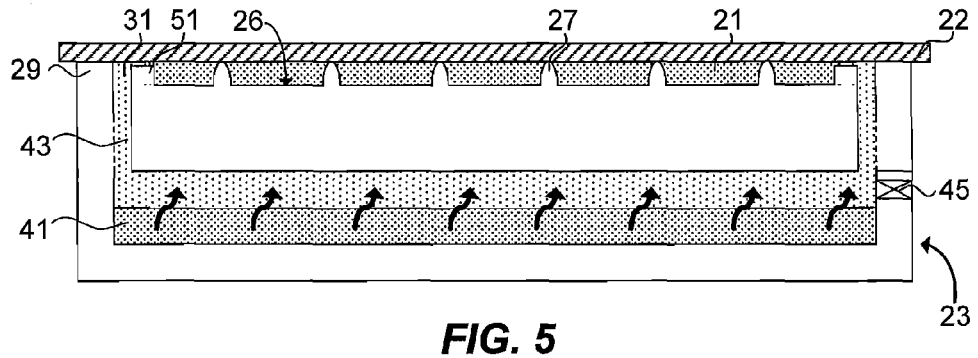
FIG. 5 is a sectional view of a substrate support structure supporting a substrate according to a second embodiment of the invention.

FIG. 5 is a sectional view of a substrate support structure 23 supporting a substrate 22 according to a second embodiment of the invention. The embodiment of the substrate support structure 23 of FIG. 5 further comprises a circumferential rim 51. The circumferential rim 51 provides a smaller distance between the substrate support structure 23 and the substrate 22. While the nominal distance between the substrate support structure 23 and the substrate 22, in FIGS. 1 and 2 referred to as height h, typically is about 3-10 microns, the distance between the circumferential rim 51 and the substrate 22 typically would lie in the range of 500 nm to 1.5 microns. Preferably, the circumferential rim 51 has a height being less than 1 micron smaller than the nominal height of contact elements provided on the surface 26 of the substrate support structure 23.

Figure 6C:
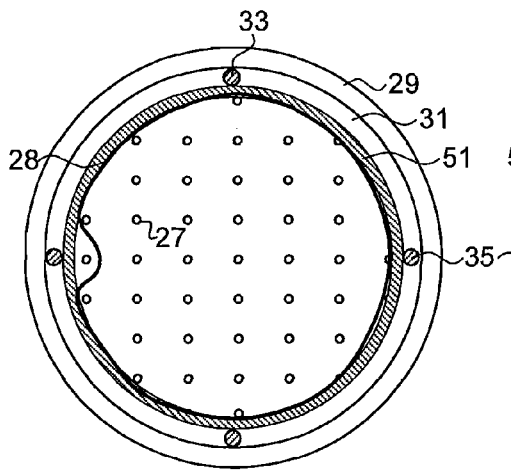
Figure 6C:
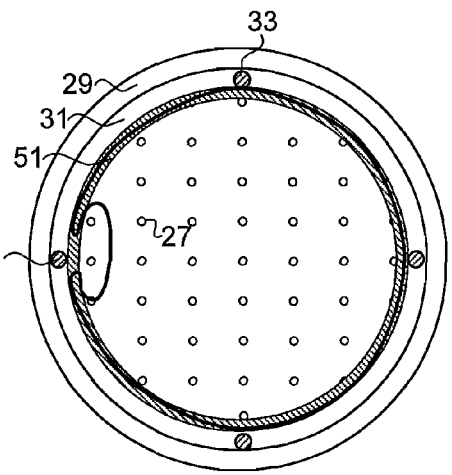
Figure 6C:
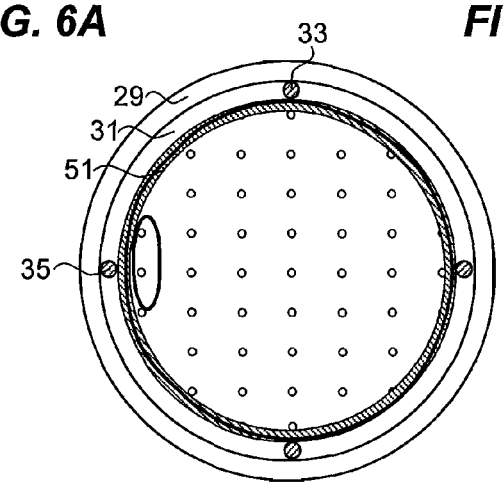

Without wishing to being bound by theory, the circumferential rim 51 is believed to limit substrate peeling in a way described with reference to FIGS. 6A-6C showing top views of the substrate support provided with a capillary layer. Although the presence of a circumferential rim 51 has been discussed with reference to FIG. 5, the use of such circumferential rim 51 is not limited to this embodiment. For example, a circumferential rim 51 may also be applied to the embodiment schematically depicted in FIG. 3A, and embodiments discussed in international patent application WO2009/011574.

First, as liquid evaporates from the outer capillary surface 28, it will recede into the small gap between the circumferential rim 51 and the substrate 22. Due to non-uniform evaporation, the outer capillary surface 28 may locally recede further inwards as schematically shown in FIG. 6A. The capillary pressure jump over the smaller gap between the circumferential rim 51 and the substrate 22 is much larger than the pressure jump would be in the main clamping area, e.g. about 1 bar versus about 200 mbar respectively. When the outer capillary surface 28 reaches the inner side surface of the circumferential rim 51 due to evaporation, the surface encounters the larger distance between substrate 22 and substrate support structure 23. The lower capillary pressure jump in this region causes a small amount of liquid to flow into the gap between the circumferential rim 51 and the substrate 22 as is schematically shown in FIG. 6B. The flow will continue until the gap between the circumferential rim 51 and the substrate 22 is completely filled as shown in FIG. 6C. A void will be left in the main clamping region. The void is entirely surrounded by a liquid layer. Effectively, the lost capillary clamping area due to evaporation has been moved inwardly. The outer capillary surface remains at the same position. As a result, the substrate edge will not peel off.

Embodiments of the substrate support structure 23 like the ones shown in FIGS. 3A and 5, may be designed in such a way that cavitation effects are minimized or non-existing. Without wishing to be bound by theory, it is understood that there is a critical radius for cavities. If the radius of a cavity becomes larger than this critical radius, the cavity may grow extensively. By using a substrate support structure that enables the formation of a capillary layer with a smallest dimension, i.e. a thickness h, that is very small, and preferably smaller than, the critical radius, cavitation will be largely limited or not occur. Experiments have shown that a capillary layer of water with a thickness h in the order of 3-10 microns does not experience cavitation.

As a specific measure, one or both of the contacting surfaces of the substrate 22 and the substrate support structure 23 may be surface treated, or coated with a material for influencing a contacting angle between the liquid forming the capillary layer 21 and the relevant contacting surface.

FIGS. 7A-7J schematically show execution of an embodiment of a method of clamping a substrate on a surface of a substrate support structure according to an embodiment of the invention. The method may be executed in a preparation unit, which allows automation of a method of clamping a substrate on a substrate support structure.

The preparation unit comprises a vacuum system that is able to provide a controlled pressure environment. Furthermore, the preparation unit comprises a liquid dispensing unit for applying liquid, one or more gas connection units for providing and removing gas, and one or more liquid connection units for providing and removing liquid.

Figure 7A:
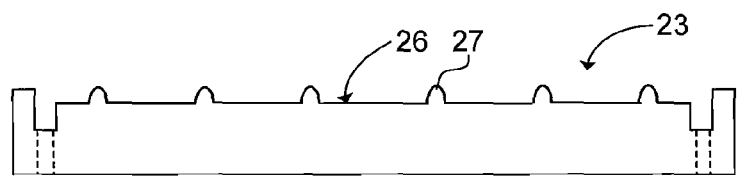
FIGS. 7A-7J schematically show execution of a method of clamping a substrate on a surface of a substrate support according to an embodiment of the invention.
Figure 7B:
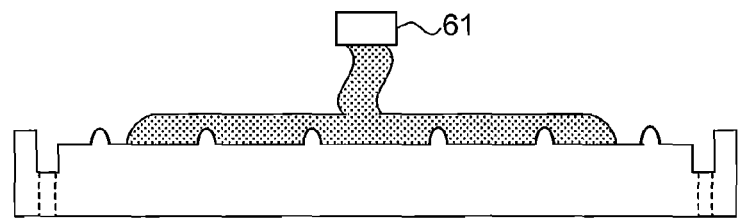

As shown in FIG. 7A, first, a substrate support structure 23 is placed in a vacuum chamber, for example a housing within the vacuum system of a preparation unit. After placement of a substrate support structure 23 in a vacuum chamber, a liquid is applied on a surface 26 thereof, schematically shown in FIG. 7B. Application of liquid on surface 26 of the substrate support structure 23 may be performed by means of a liquid dispensing unit 61.

In FIGS. 7A-7J, the surface 26 of the substrate support structure 23 is provided with contact elements, e.g. burls 27. In one embodiment, applying the liquid continues at least until the contact elements are covered by a liquid layer 64. A typical thickness of the liquid layer 64 after the applying of liquid is in the range of 2-5 mm. Applying the liquid is preferably performed at a pressure level substantially equal to the vapor pressure of the liquid in the liquid layer 64. Applying the liquid at such pressure reduces the chance of dissolving of gases and/or entrainment of bubbles in the liquid.

Figure 7C:
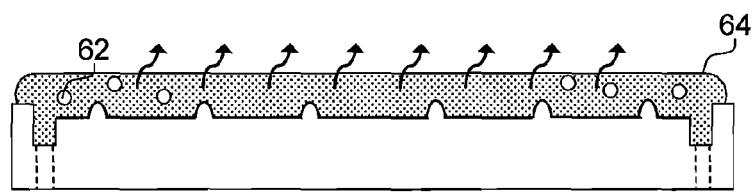

Optionally, after applying the liquid, a pausing action is performed. This action is schematically shown in FIG. 7C. The pausing allows diffusion of dissolved gases and/or entrained bubbles 62 out of the liquid layer 64. The removal of dissolved gases and/or entrained bubbles 62 reduces the chance of formation of voids as discussed with reference to FIG. 2.

Figure 7D:
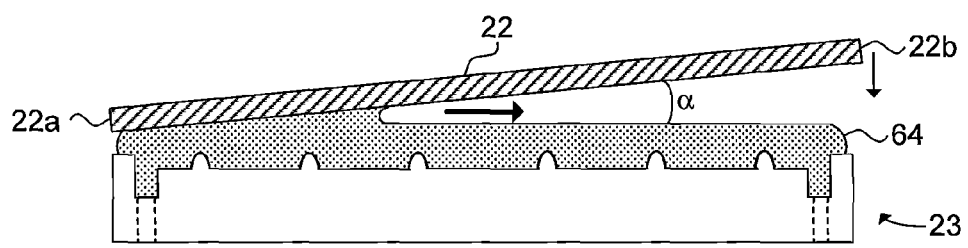

Then, a substrate 22 is placed on top of the liquid layer 64. Preferably, as schematically shown in FIG. 7D, the substrate is placed such that an edge at a first end portion 22a of the substrate 22 contacts the liquid layer 64 first at an initial angle, hereafter referred to as the tilt angle. After the first contact, the non-contacting end portion 22b of the substrate 22 is lowered until the substrate 22 fully rests on the liquid layer 64 as shown in FIG. 7E.

In FIG. 7D, the substrate 22 is placed at an initial angle α. The liquid contacts the bottom surface of the substrate 22 and adheres to it due to capillary effects. In one embodiment, after first contact of one end portion 22a of the substrate 22, the other end portion 22b of the substrate 22 is lowered such that the water-substrate contact line moves along the bottom surface of the substrate 22 in the direction of the other end portion 22b, in FIG. 7D a movement to the right schematically illustrated by the arrow. Placement of the substrate 22 at a tilt angle reduces the chance of capturing air or gas between the substrate 22 and the substrate support structure 23, which improves the stability of the clamp to be established. The tilt angle alpha (α) is an acute angle, preferably smaller than 10 degrees, and preferably greater than 5 degrees. Experiments have shown that such a tilt angle provides satisfactory results.

Figure 7E:
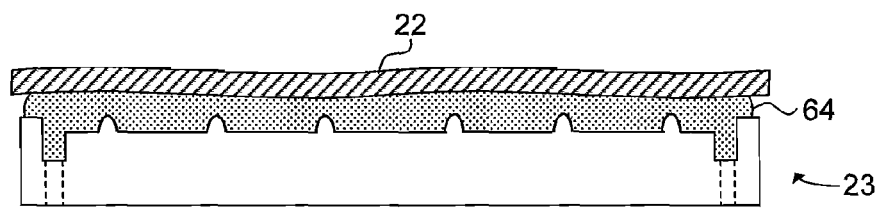

FIG. 7E shows the substrate 22 after placement onto the liquid layer 64. The substrate 22 floats on the liquid layer 64.

Figure 7F:
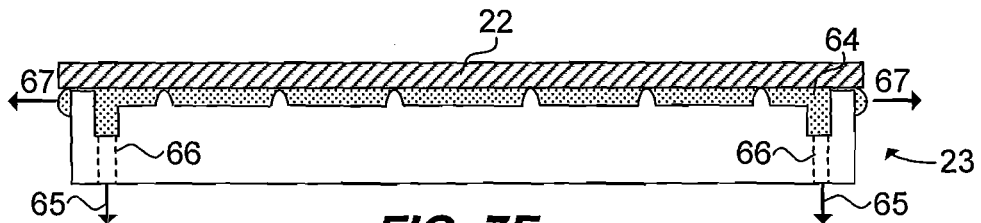

After placement of the substrate on top of the liquid layer, excess liquid is removed. The removal of excess liquid may comprise lowering a pressure underneath the substrate 22 to a pressure level substantially below the pressure level of the pressure surrounding the substrate support structure 23. This may be achieved by connecting the area underneath the substrate 22 with a low pressure environment, in FIG. 7F, schematically represented by arrows 65.

Due to the resulting difference between a pressure level above the liquid layer 64 and a pressure level below the liquid layer 64, the substrate 22 is pulled towards the substrate support structure 23. As a result, excess liquid is either sucked away via one or more channels 66, for example channels 33 and 35 of the gas distribution system depicted FIG. 3B, and/or squeezed out of the edge of the substrate support structure 23, schematically represented in FIG. 7F by arrows 67. After some time, the substrate 22 rests on the contact elements 27 of the substrate support structure surface 26.

The removal of excess liquid may further, or alternatively, comprise providing a gas flow along a circumference of the surface 26. The gas flow is provided at a pressure that is lower than the pressure above the substrate 22 so that the substrate 22 remains in contact with the contact elements. Suitable gases to be used in the gas flow include nitrogen, oxygen and helium.

The gas flow may remove excess liquid in one or more ways. For example, liquid may be swept away by the flow. Additionally, remaining droplets may evaporate in the gas flow. Evaporation of remaining droplets may be enhanced by providing dehumidified or "dry" gas, i.e. gas having a vapor content of less than 50%, preferably less than 10%, of its vapor saturation value.

Figure 7G:
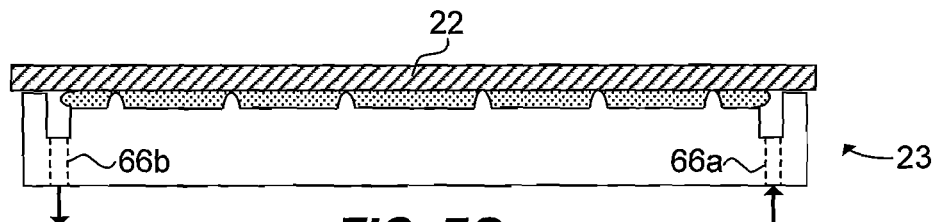
Figure 7H:
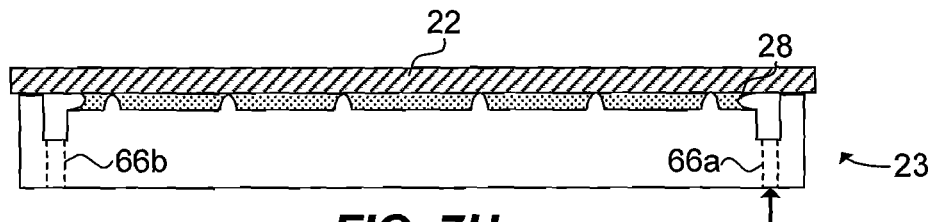

The providing of a gas flow is schematically shown in FIGS. 7G and 7H. Gas is allowed to enter the substrate support structure 23 via channel 66a, while gas is allowed to exit via channel 66b. Channel 66a and channel 66b may correspond to gas inlet 33 and gas inlet 35 in FIG. 3B respectively. The gas flow is preferably maintained until a capillary layer 71 is formed, i.e. a thin layer of liquid with a concave outer surface 28 having a pressure below the pressure of its surroundings. Such a capillary layer has been discussed with reference to FIGS. 1 and 2.

Figure 7I:
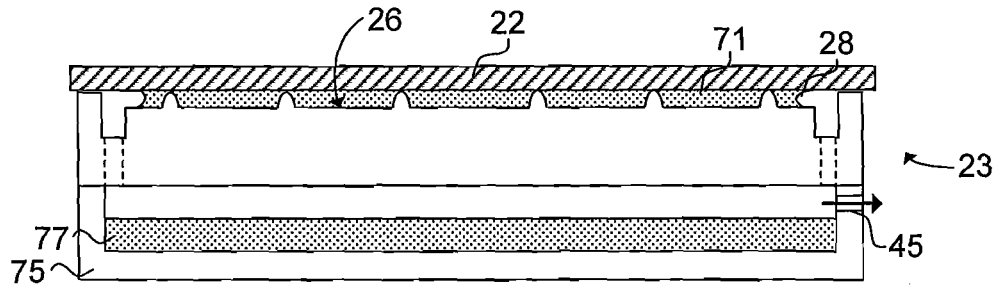

After formation of the capillary layer due to the removal of excess liquid, the ambient pressure may be lowered. In order to be sure that the substrate 22 remains clamped, excess gas, if present, may be removed underneath the substrate 22, for example via valve 45 as schematically shown in FIG. 7I.

Figure 7J:
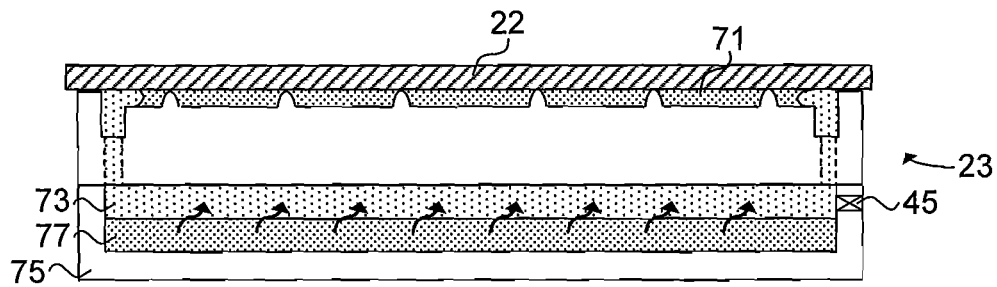

In embodiments of the invention, after formation of the capillary layer 71, vapor may be provided to the capillary layer. The vapor 73 may be provided by a reservoir 75 at least partly filled with reservoir liquid 77. The reservoir 75 may be part of the substrate support structure 23 as shown in FIGS. 7I and 7J. Alternatively, the reservoir 75 may be an external reservoir. The vapor 73 may then be provided via a transfer system connectable to both the external reservoir and the substrate support structure 23.

It must be noted that the liquid vapor reservoir 75 may be provided as a separate module that can be connected to the substrate support structure 23. The provided vapor limits evaporation of liquid from the capillary layer 71. This may lead to a longer lifetime of the clamp.

FIG. 8 schematically shows a top view of a substrate support structure 83 according to another embodiment of the invention. The substrate support structure 83 comprises a surface 86 for clamping a substrate. Preferably, the surface is provided with contact elements 87. Additionally, the substrate support structure comprises a gas distribution system including a moat 91, gas inlets 93, and gas outlets 95. Functions of these components have been discussed with reference to FIG. 3A and equally apply for this embodiment. The substrate support structure 83 may be used in embodiments of the substrate handling and exposure arrangement described below and the method of clamping in a similar way as described with respect to substrate support structure 23 and with reference to FIGS. 7A-7J.

In contrast to embodiments of the substrate support structure 23 shown in FIGS. 3A and 5, substrate support structure 83 comprises a surface 86 which is divided in a plurality of sub-surfaces. The sub-surfaces may take the form of tiles, for example of hexagonal shape, and be arranged in a tessellated pattern. Each tile may be provided with a circumferential rim (not shown), similar to the circumferential rim 51 discussed with reference to FIG. 5. The use of a surface 86 divided in a plurality of sub-surfaces may be beneficial if relatively large substrates need to be clamped, for example 300 mm wafers.

FIG. 8B schematically shows a sectional view of a clamp formed by a combination of the substrate support structure 83 of FIG. 8A and a substrate 82 for illustrative purposes.

FIGS. 9-12 schematically show different substrate handling and exposure arrangements which may be used in conjunction with embodiments of the substrate support structures described above. Although FIGS. 9-12 are explained with reference to an example related to lithographic processing of wafers, it should be understood that the arrangements are not limited to such an application. FIGS. 9-12 show embodiments of a preparation unit that may be used to automate clamping of a substrate on a substrate support structure, for example as explained with reference to FIGS. 7A-7J. This method of clamping is especially suited for substrates undergoing charged particle lithography, but other clamping methods may be used, such as air suction, freezing the substrate to the substrate support structure, electromagnetic clamping etc., depending on the type of subsequent processing to be used on the substrate. The preparation unit may alternatively or additionally perform other functions for preparing a substrate and/or substrate support structure for further processing such as lithography.

Figure 9:
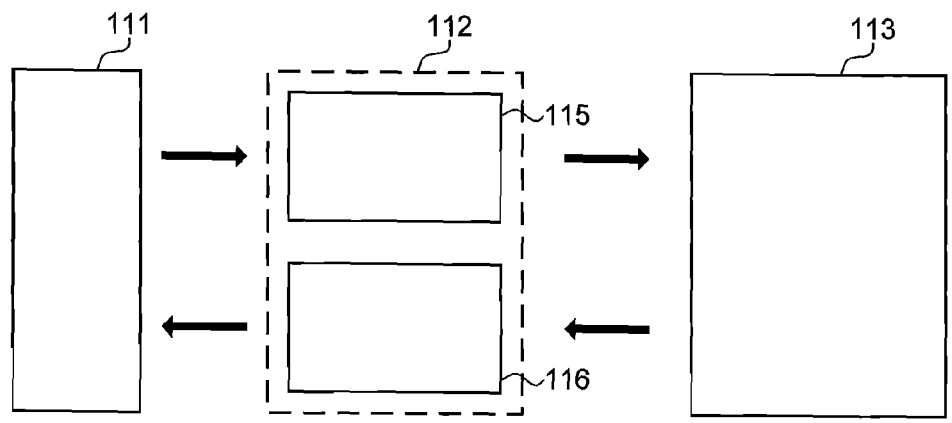
FIG. 9 schematically shows a substrate handling and exposure arrangement which may be used in conjunction with embodiments of the substrate support structure.

Now referring to FIG. 9, in the substrate handling and exposure arrangement, a preparation unit 112 is used to automate a method of clamping a wafer on a wafer support structure. The preparation unit 112 accepts a wafer to be clamped from a substrate distribution facility, in this example a so-called wafer track or wafer supply 111. In the preparation unit 112, the clamp is prepared, e.g. by using the method outlined with respect to FIGS. 7A-7J. After preparation of the clamp, the clamp (substrate clamped to the substrate support structure) is forwarded to a substrate processing unit, in this example a lithographic apparatus 113. The lithographic apparatus may comprise a radiation system to provide a patterned beam of radiation, a substrate support structure to support a substrate, and an optical system to project the patterned beam of radiation onto a target portion of the substrate as will be understood by a person skilled in the art. Further details regarding operation of an exemplary preparation unit will be explained with reference to FIGS. 14A-14D.

In FIG. 9, the clamping procedure is schematically denoted by reference number 115. Further details regarding operation of an exemplary preparation unit will be explained with reference to FIGS. 14A-14D. The preparation unit 112 comprises a vacuum system for providing a controlled pressure environment. The clamping procedure may start with the introduction of a wafer 122 into the vacuum system of the preparation unit 112, for example by means of a robot arm provided with a wafer support 121 as shown in FIG. 14A.

The wafer 122 may be introduced via a vacuum tight door or a load lock chamber. The wafer support structure 123 may already be present in the preparation unit 112. Alternatively, the wafer support structure 123 may be introduced in a similar way as the wafer 122.

Figure 14A:
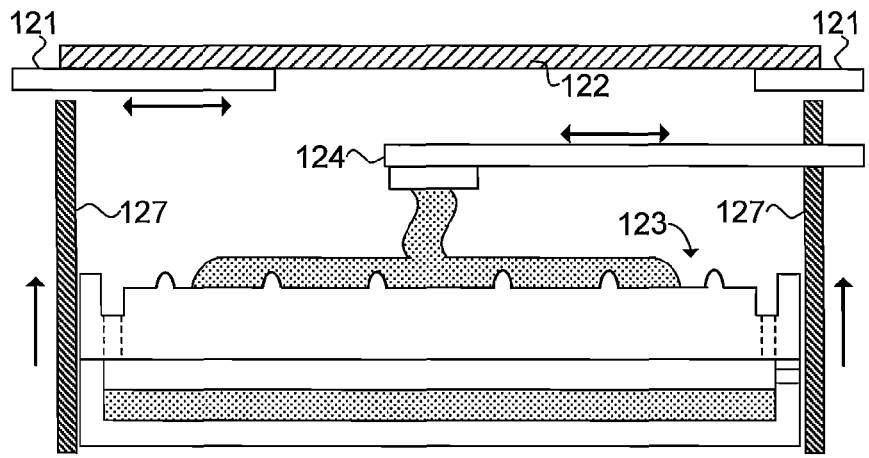
FIGS. 14A-14D schematically show operation of an exemplary preparation unit to be used in the substrate handling and exposure arrangement of FIG. 9 or FIG. 11.

Then, liquid may be applied onto the surface of the wafer support structure 123 by means of the liquid dispensing unit 124 as shown in FIG. 14A. The liquid dispensing unit 124 provides a liquid flow until a liquid layer of sufficient "thickness" is provided, and then shuts off the liquid flow. Preferably, the liquid dispensing unit 124 is moveable within the preparation unit 112 such that applying of liquid is performed in an efficient manner without disturbing earlier and subsequent actions in the clamping procedure. Preferably, the pressure in the preparation unit 112 during applying the liquid onto the surface of the wafer support structure 123 is below ambient pressure, for example substantially equal to the vapor pressure of the liquid in the liquid layer. Alternatively, the pressure in the preparation unit may be reduced after applying the liquid but before clamping the wafer.

Figure 14B:
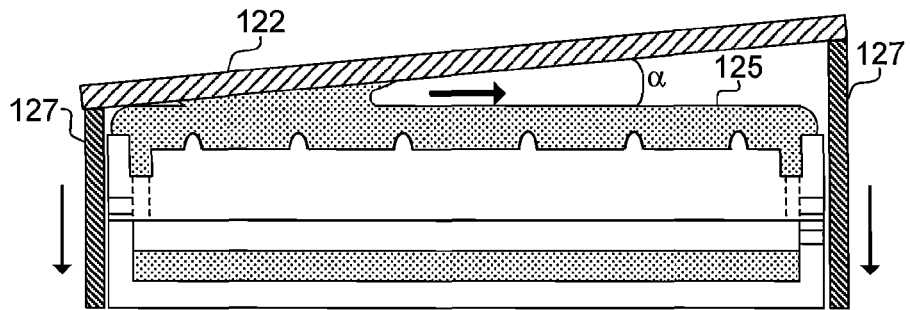

The wafer 122 and wafer support structure 123 are then moved with respect to each other to allow placement of the wafer on the liquid layer 125. For this purpose, the wafer 122 is lowered onto the liquid layer 125 by means of a substrate transfer unit, for example moveable support pins 127 as shown in FIG. 14B. As discussed earlier with reference to FIG. 7D, the first contact between the wafer 122 and the liquid layer 125 may be made at an initial tilt angle alpha (α), preferably less than 10 degrees and preferably greater than 5 degrees. Such tilted placement may be achieved by lowering one side of the wafer 122 before lowering the other side of the wafer 122, for example by separate controlled movement of the support pins 127. Each side of the wafer 122 is lowered until contact is made with the liquid layer 125, and the support pins 127 may then be lowered further and moved out of the way. Placement of the wafer 122 on the liquid layer 125 may be performed at ambient pressure, i.e. about 1 bar. However, placement at low pressure is preferred, for example a pressure substantially equal to the vapor pressure of the liquid in the liquid layer.

Figure 14C:
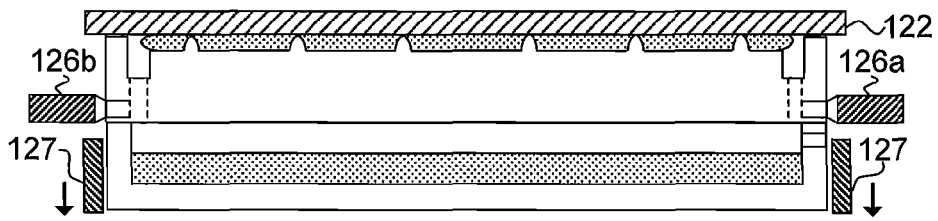

The wafer support structure 123 may now be connected to one or more liquid connection units connectable to the wafer support structure 123 for removing liquid away from the wafer support structure. In one embodiment, connectors 126a, 126b as shown in FIG. 14C may be used for this purpose. Alternatively, connecting of these one or more liquid connection units has been established earlier. Excess liquid is removed via the one or more liquid connection units. Removal of liquid may be performed at ambient pressure, i.e. about 1 bar.

Furthermore, the wafer support structure 123 may comprise one or more gas connection units for connecting the wafer support structure 123 with a gas supply, for example the same connectors 126a, 126b used for the liquid may be used, or a separate set of connectors used for the gas. The gas connection units may establish a low pressure by "connection" to a vacuum. Additionally and/or alternatively, the gas connection units may provide a gas flow for enabling formation of a capillary layer between the wafer 122 and the wafer support structure 123 as discussed earlier with reference to FIGS. 7A-7J. Providing a gas flow may be performed at ambient pressure, i.e. about 1 bar. Note that the pressure provided by the gas flow needs to be lower than the ambient pressure to ensure that the wafer 122 keeps its position with respect to the wafer support structure 123.

Figure 14D:
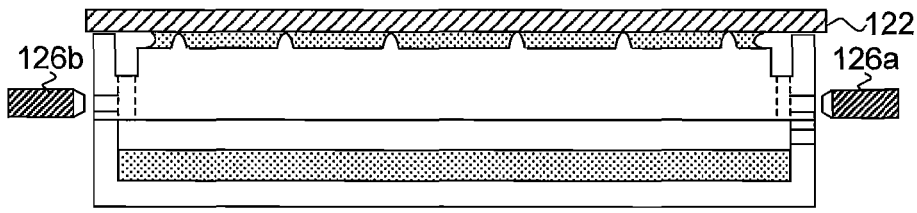

Before forwarding the clamp to the lithographic apparatus 113, as schematically shown in FIG. 14D, the connections 126a, 126b are removed. Forwarding the clamp may be performed by means of a robot arm via a vacuum tight door or a load lock chamber.

After processing in the lithographic apparatus 113, the clamp may be transferred back to the preparation unit 112 or to a separate unclamping unit for unclamping, i.e. removing the wafer from the wafer support structure. In FIG. 9, the process of unclamping is schematically denoted by reference number 116. Unclamping may be performed by introducing the clamp into the preparation unit 112, connecting the one or more liquid connectors to the wafer support structure 123. Via the one or more liquid connectors, additional liquid may be provided to the capillary liquid layer to increase the thickness of the liquid layer. Additional liquid may be added so that the wafer 122 starts to float on top of a liquid layer. The introduction of additional liquid may be applied in such a way that liquid pressure is substantially homogeneously distributed so that the wafer 122 will not deform or break.

At that stage, the wafer 122 may be lifted from the liquid layer on the wafer substrate support surface 123, e.g. by means of support pins 127. The wafer may be lifted at an initial tilt angle, in the reverse of the process described above of placing the wafer onto the liquid layer. The initial tilt angle during lifting of the wafer is preferably less than 10 degrees and preferably greater than 5 degrees, which may be achieved by lifting one side of the wafer before lifting the other side, for example by separate controlled movement of the support pins. Finally, the wafer 122 may be extracted from the preparation unit 112, for example by using a robot arm provided with wafer support 121, and transferred towards the wafer track/wafer supply 111.

In FIG. 9, the preparation unit 112 and the lithographic apparatus 113 are depicted as separate units. However, it must be understood that it is also possible to integrate the preparation unit 112 into a lithographic apparatus 113, for example by including the required functionality of the preparation unit 112 in a load lock of the lithographic apparatus 113. In such a case, wafers will be clamped and unclamped as they enter and exit the lithographic apparatus respectively.

Figure 10:
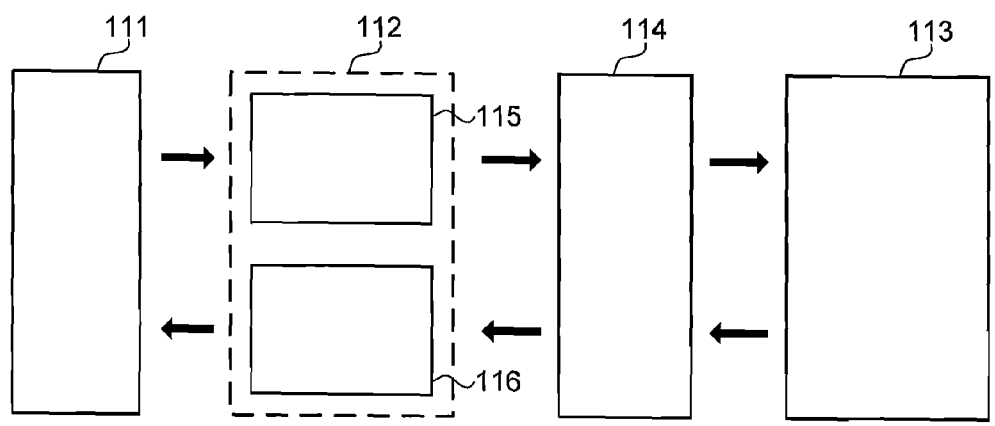
FIG. 10 schematically shows another substrate handling and exposure arrangement including a load lock chamber.

FIG. 10 shows an example of a substrate handling and exposure arrangement including a load lock 114. The load lock receives a substrate clamped to a substrate support surface from the preparation unit 112. The load lock comprises a vacuum chamber with vacuum pumps for pumping down to a vacuum suitable for transfer of the clamped substrate and substrate support to the lithographic apparatus 113, and vents for venting to reduce the vacuum after processing of the clamped substrate in the lithographic apparatus.

Figure 11:
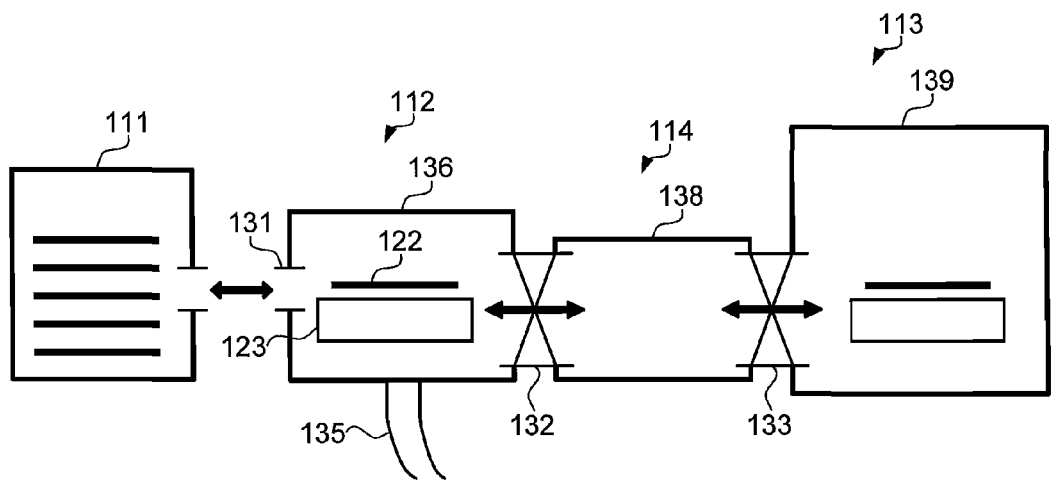
FIG. 11 shows further details of the substrate handling and exposure arrangement of FIG. 10.

FIG. 11 shows additional details of the substrate handling and exposure arrangement of FIG. 10. The preparation unit 112 comprises a housing 136, which may be used to create a controlled pressure environment for performing the clamping or other operations, e.g. a vacuum chamber, with a port 131 for transfer of an unclamped substrate 122 from the wafer track or supply 111, shown with multiple substrates in a cassette or supply arrangement. A substrate is loaded into the preparation unit 112 via a loading port 131 sized for receiving an unclamped substrate. The substrate is clamped to the substrate support surface 123 and the clamped substrate is transferred via an unloading port 132 to the load lock chamber 114. Conditioning of the substrate support surface may also be performed in the preparation unit 112 as described below. The load lock chamber includes a vacuum chamber 138, which after receiving the clamped substrate is pumped down to a high vacuum suitable for transfer of the clamped substrate via port 133 to the lithographic apparatus 113. The lithographic apparatus 113 includes a substrate processing compartment 139, typically comprising or located within a vacuum chamber. After processing in the lithographic apparatus, the clamped substrate is removed from the substrate processing compartment via port 133 (or alternatively via a separate port) to the load lock where the high vacuum is vented, and back to the preparation unit via port 132 (or alternatively via a separate port) for unclamping the substrate and conditioning of the substrate support structure.

Figure 12:
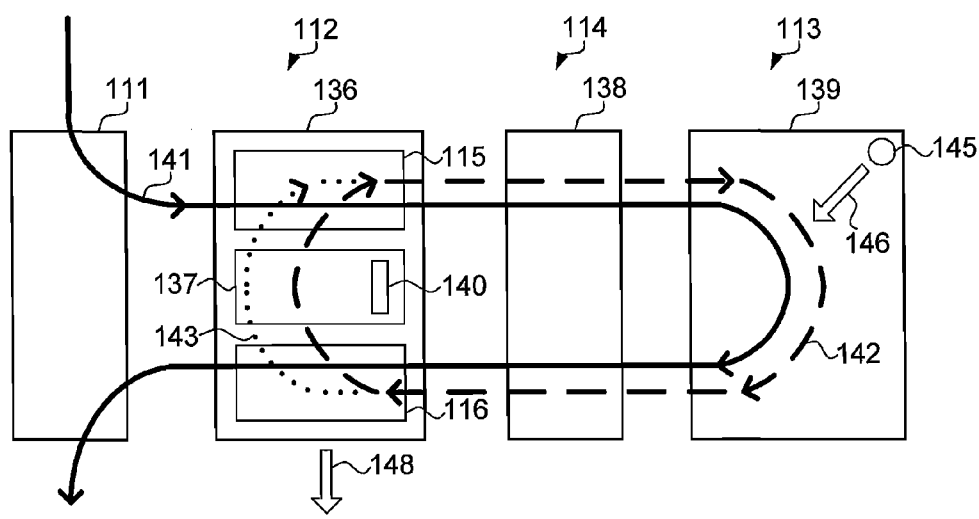
FIG. 12 shows an example of substrate and substrate support structure flow for the substrate handling and exposure arrangement of FIG. 10.

FIG. 12 illustrates the movement of a substrate and substrate support structure in one embodiment of the substrate handling and exposure arrangement of FIG. 10. A substrate flow 141 is shown with a solid line indicating the path of a substrate, and a substrate support structure flow 142 is shown with a dashed line indicating the recirculating path for a substrate support structure.

The substrate flow 141 illustrates the path of a substrate from a wafer track or supply unit 111 to the preparation unit 112 for the clamping operation 115. The clamped substrate, together with the substrate support, then proceeds to the load lock chamber 114 and on to the lithographic apparatus 113 for processing in substrate processing compartment 139, and after processing back to the preparation unit for unclamping and lifting of the substrate from the substrate support. The substrate then moves back to the wafer track/supply unit 111 for transport to further processing units. The substrate support structure flow 142 illustrates the recirculation of substrates supports from the preparation unit 112 via load lock 114 to the lithographic apparatus 113 and back again in a recirculating path for reuse of the substrate supports. An alternative flow path 143 illustrates the optional conditioning of a substrate support after being unloaded and before being loaded with a new substrate. A buffer 137 may be included in the recirculation path 142 or 143, e.g. a last-in last-out storage system for holding a small number of substrate support structures ready for reuse. Conditioning of the substrate supports may be performed while they are in the buffer store, or the buffer store may receive the substrate supports after conditioning and hold them ready for reuse.

Following the substrate flow 141, after clamping, the substrate clamped to the substrate support structure together are transferred for substrate processing in the lithographic apparatus 113 via the load lock 114. The lithographic apparatus 113 includes a substrate processing compartment 139, typically a vacuum chamber, having a charged particle source or light source 145 for generating charged particles or light beams for projection onto the substrate during the lithography process. During lithographic processing, energy is absorbed (shown as arrow 146) by the substrate from the charged particle or optical beams used to expose the substrate. The resulting buildup in energy in the substrate results in heating of the substrate, which may result in undesirable effects such as thermal expansion of the substrate and degradation of the lithographic process.

The substrate support structure may serve not only as a support structure for clamping the substrate, but also as an energy absorbing unit for absorbing energy from the substrate. The substrate support structure is preferably adapted to absorb energy from the substrate to reduce substrate heating. Good thermal contact between the substrate and substrate support structure is required for good energy transfer to the support structure. The clamping liquid layer provides for excellent thermal contact between the substrate and substrate support structure.

Energy transferred from the substrate may be stored in the substrate support structure. The substrate support structure may be constructed to have a high thermal mass (heat capacity) to act as a heat sink, by constructing it with a large mass and/or constructing of material with a high specific heat capacity. A heat absorbing substance designed to undergo a phase transition may also be incorporated into the substrate support structure, as described in international application WO2008/013443, which is hereby incorporated by reference in its entirety. The phase transition substance acts as a thermal buffer to absorb energy while undergoing a phase change, e.g. melting, which enables the substrate support structure to absorb energy from the substrate while maintaining a uniform temperature for a prolonged period of time, preferably sufficient to perform the lithography process on the full substrate, thereby enhancing accurate projection onto the substrate. In one embodiment, the support structure comprises such a thermal buffer substance comprised of gallium or gallium compounds, achieving prolonged temperature stability at a preferred temperature level at or around room temperature.

After processing of the substrate, the combination of substrate and substrate support structure is removed from the processing chamber of the lithographic apparatus 113 via the load lock chamber 114 and transferred to the preparation unit 112, where the substrate is removed from the support in the unclamping operation 116 and the substrate support structure may follow path 142 for clamping to another substrate or path 143 to undergo conditioning before reuse. Part of the energy from the charged particles or light beams generated in the lithography apparatus is removed from the substrate processing compartment of the lithography machine by the substrate support structure when it is removed from the compartment. The preparation unit may function as an energy discharge unit to remove energy stored in the substrate support structure (shown as arrow 148). In this way the substrate support structure is conditioned by releasing its energy, preferably without cooling it down. The energy flow arrows 146 and 148 thus indicate the energy path within the lithography system.

Release of the energy may be performed passively, e.g. while the substrate support sits in the buffer store, by allowing the substrate support to release its energy by thermal radiation or thermal contact with the structure of the preparation unit. The energy release may also be performed actively, e.g. by exposing the substrate support structure to an energy discharge medium, such as a liquid or gas, which is transported out of the preparation unit 112 via fluid supply and discharge lines at an energy exit point (arrow 148) for subsequent cooling. The energy discharge medium preferably comprises a liquid, and may subsequently be used at least in part as capillary liquid for clamping a substrate as described herein. A gas may also be used as the energy discharge medium, directed over the surface or through open conduits in the substrate support structure.

A thermoelectric cooling element 140 using the so-called Peltier effect may also be used, in thermal contact with the substrate support. The Peltier cooling element comprises two different types of materials arranged to form a junction. The transfer of heat from the one material to the other takes place with consumption of electrical energy. Connecting the cooling element to a direct current voltage source causes one side of the element to cool while the other side is heated. Heat may be removed from the heated side of the element, using a cooling fluid for example.

Figure 13:
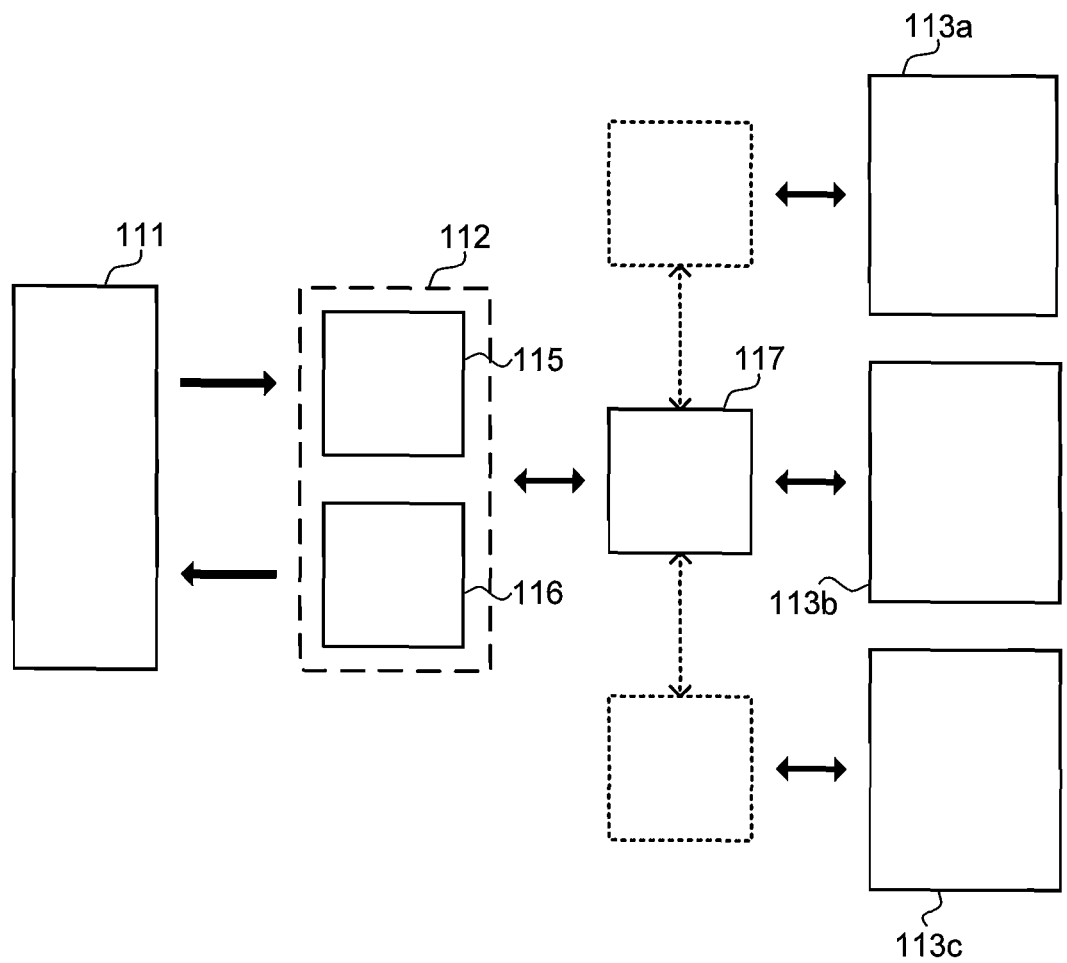
FIG. 13 schematically shows a different substrate handling and exposure arrangement that may be used in conjunction with embodiments of the substrate support structure.

FIG. 13 schematically shows a different substrate handling and exposure arrangement that may be used in conjunction with embodiments of the substrate support structure. In the arrangement of FIG. 13, instead of a single lithographic apparatus 113 more lithographic apparatus 113a, 113b, 113c are used. The functionality of the wafer track/wafer supply 111 and the preparation unit 112 is the same as described with reference to FIG. 9.

In FIG. 13, a clamp ready to be transferred to a lithographic apparatus for processing may be transferred towards three different lithographic apparatus 113a, 113b, 113c via an additional wafer track 117. The configuration of FIG. 13 may be more efficient if the typical duration of the clamping method to be performed within the preparation unit 112 is faster than the typical duration of a lithographic process to be performed in any one of the lithographic apparatus 113a, 113b, 113c.

Throughout the description, reference has been made to the expression "capillary layer". The expression "capillary layer" should be understood to refer to a thin layer of liquid with a concave meniscus shape having a pressure below the pressure of its surrounding.

Additional aspects of the present invention are further defined in a substrate support structure for clamping a substrate on a surface thereof, where the substrate support structure comprises a surface for receiving a substrate to be clamped by means of a capillary layer of a liquid, a liquid reservoir for storing reservoir liquid and vapor of the reservoir liquid, and a vapor transfer system connecting the reservoir with the receiving surface such that vapor of the reservoir liquid can be provided to the capillary layer when present. The reservoir may extend underneath the receiving surface. Preferably, the reservoir comprises a cavity having a greater portion located underneath the receiving surface and a lesser portion extending out from a circumference of the receiving surface. The volume for storage of the reservoir liquid in the reservoir may be greater than a volume of the capillary layer of liquid. The reservoir may be detachable from the receiving surface. In use, the capillary layer may have a concavely shaped outer surface, and a free surface area of the liquid in the reservoir is larger than a free surface area of said concavely shaped outer surface. The substrate support structure may further comprise a liquid removal system for removing liquid circumferential to said surface. The liquid removal system may comprise a gas distribution system. The gas distribution system may comprise at least one gas inlet for providing gas, and at least one gas outlet for removing gas. Alternatively, the gas distribution system may have a plurality of gas inlets and a plurality of gas outlets at equidistant positions with respect to each other. The substrate support structure may further comprise a gas connection unit for connecting the substrate support structure with a gas supply. The gas connection unit may be connected to the vapor transfer system. The vapor transfer system may comprise a flow control unit for separating gas flow via the gas connection unit from vapor originating from the reservoir. The flow control unit may be a valve or flap. The reservoir of the substrate support structure may be located in a removable portion of the substrate support structure. The reservoir and the vapor transfer system may be located in a removable portion of the substrate support structure. The substrate support structure may further comprise a sealing structure circumscribing the receiving surface such that gas provided by the gas distribution system can flow between the receiving surface and the sealing structure. The receiving surface may be provided with a plurality of contact elements, and wherein the sealing structure has a height corresponding to the height of the plurality of contact elements. Alternatively, the receiving surface may further comprise a raised circumferential rim, such that gas provided by the gas distribution system can flow between the circumferential rim and the sealing structure. In such embodiment, the receiving surface may be provided with a plurality of contact elements, and wherein the circumferential rim has a height smaller than the height of the plurality of contact elements. The receiving surface may be divided into a plurality of sub-surfaces. The liquid removal system may then be configured to remove liquid circumferential to each sub-surface. In case of a plurality of sub-surfaces, at least one sub-surface may have a substantially hexagonal shape.

An additional aspect of the present invention is further defined in a method for maintaining a substrate clamped to a substrate support structure, where the method comprises providing a substrate support structure having a surface on which a substrate has been clamped by means of a capillary layer, providing a reservoir storing reservoir liquid and vapor of the reservoir liquid, and enabling transfer of the vapor of the reservoir liquid from the reservoir to the capillary layer to limit evaporation from the capillary layer. The substrate support structure may be any substrate support structure described earlier.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A charged particle lithography system comprising a preparation unit configured to clamp a substrate on a surface of a substrate support structure by means of a capillary liquid layer, and a lithography apparatus for performing a lithographic process on the substrate clamped onto the substrate support structure, the preparation unit comprising:
a housing having a first load port for loading and/or unloading a substrate into or out of the housing;
a substrate transfer unit for locating the substrate onto a substrate support structure within the housing so as to enable preparation of a substrate support structure with a substrate clamped thereon; and
a second load port for loading and/or unloading the substrate support structure with the substrate clamped thereon into or out of the housing; and the lithography apparatus comprising a substrate processing compartment, the substrate processing compartment of the lithography apparatus being arranged to receive the substrate support structure with the substrate clamped thereon via the second load port.

2. The system of claim 1, the preparation unit further comprising an energy discharge system for removing energy accumulated in the substrate support structure as a result of the lithographic process, after removal of the substrate support structure from the substrate processing compartment and loading the substrate support structure supporting the substrate into the housing via the second load port.

3. The system of claim 2, wherein said preparation unit is provided with connections for discharge and supply of an energy transport medium for the energy discharge system.

4. The system of claim 3, wherein said energy transport medium comprises a liquid and is used at least partly for a capillary liquid layer for clamping the substrate on a surface of the substrate support structure.

5. The system of claim 2, wherein said energy discharge system comprises an electrically driven thermoelectric cooling element.

6. The system of claim 1, wherein an energy transport medium is provided for said capillary liquid layer in excess of the amount of liquid required for clamping the substrate.

7. The system of claim 1, wherein said preparation unit further comprises a liquid dispenser for dispensing liquid on a surface of the substrate support structure to form the capillary liquid layer.

8. The system of claim 1, wherein the pressure within the housing can be lowered to a pressure substantially equal to the vapor pressure of the liquid in the capillary layer.

9. The system of claim 1, wherein said substrate transfer unit comprises support pins for lowering the substrate onto the substrate support structure.

10. The system of claim 1, wherein the preparation unit further comprises one or more gas connectors connectable to the substrate support structure for providing gas to and/or removing gas from the surface of the substrate support structure.

11. The system of claim 1, wherein the preparation unit further comprises one or more liquid connectors connectable to the substrate support structure for providing liquid to and/or removing liquid from the surface of the substrate support structure.

12. The system of claim 1, the preparation unit further comprising:
 a liquid dispenser for dispensing liquid on a surface of a substrate support structure;
 one or more gas connectors for providing gas to and/or removing gas from the surface of the substrate support structure; and
 one or more liquid connectors for providing liquid to and/or removing liquid from the surface of the substrate support structure;
 wherein the substrate support structure is connectable and disconnectable from the one or more gas connectors, and the one or more liquid connectors.

13. The system of claim 1, further comprising a plurality of lithographic apparatus, each lithographic apparatus comprising a radiation system to provide a patterned beam of radiation, a substrate support structure to support a substrate, and an optical system to project the patterned beam of radiation onto a target portion of the substrate, and wherein the preparation unit is configured to provide a substrate clamped to a substrate support structure for each of the plurality of lithographic apparatuses.

14. The system of claim 1, further comprising a load lock chamber provided between the lithography apparatus and the housing of the preparation unit, the load lock chamber comprising a vacuum chamber being arranged for receiving the substrate support structure with the substrate clamped thereon via the second load port and pumping down a pressure within the vacuum chamber to a pressure suitable for transfer of the substrate support structure with the substrate clamped thereon to the lithography apparatus, and a further load port for transferring the substrate support structure with the substrate clamped thereon to the lithography apparatus.

15. A method for preparing a substrate for lithographic processing, the method comprising:
 providing a controlled pressure environment in a housing;
 loading the substrate into the housing;
 providing the substrate support structure in the housing;
 clamping the substrate on a surface of the substrate support structure by means of a capillary layer so as to form a substrate support structure with a substrate clamped thereon; and
 unloading the substrate support structure with the substrate clamped thereon out of the housing.

16. The method of claim 15, further comprising dispensing a liquid on a surface of a substrate support structure to form the capillary layer and lowering the substrate onto the dispensed liquid.

17. The method of claim 15, further comprising connecting one or more gas connectors to the substrate support structure and providing gas to and/or removing gas from the surface of the substrate support structure.

18. The method of claim 15, further comprising connecting one or more liquid connectors to the substrate support structure and providing liquid to and/or removing liquid from the surface of the substrate support structure.

19. The method of claim 15, further comprising lowering the pressure within the housing to a pressure substantially equal to the vapor pressure of the liquid in the capillary layer.

20. The method of claim 15, further comprising:
 dispensing a liquid on a surface of a substrate support structure;
 connecting one or more gas connectors to the substrate support structure and providing gas to and/or removing gas from the surface of the substrate support structure; and
 connecting one or more liquid connectors to the substrate support structure and providing liquid to and/or removing liquid from the surface of the substrate support structure; and
 disconnecting the one or more gas connectors and the one or more liquid connectors from the substrate support structure.

21. The method of claim 15, further comprising conditioning the substrate support structure before clamping the substrate on a surface of the substrate support structure by actively removing energy accumulated in the substrate support structure as a result of a previous lithographic process.

22. The method of claim 21, wherein conditioning the substrate support structure comprises exposing the substrate support structure to an energy transport medium for removing the stored energy.

23. The method of claim 21, wherein conditioning the substrate support structure comprises placing the substrate support structure in thermal contact with an electrically driven thermoelectric cooling element.

* * * * *